United States Patent [19]

Ogihara et al.

[11] Patent Number: 5,420,816
[45] Date of Patent: May 30, 1995

[54] SEMICONDUCTOR MEMORY APPARATUS WITH CONFIGURED WORD LINES TO REDUCE NOISE

[75] Inventors: Masaki Ogihara, Yokohama; Syuso Fujii, Kawasaki, both of Japan

[73] Assignee: Kabushiki Kaisha Toshiba, Kawasaki, Japan

[21] Appl. No.: 299,086

[22] Filed: Aug. 31, 1994

Related U.S. Application Data

[63] Continuation of Ser. No. 48,213, Mar. 10, 1993, abandoned, which is a continuation of Ser. No. 586,155, Sep. 21, 1990, abandoned.

[30] Foreign Application Priority Data

Sep. 27, 1989 [JP] Japan ................................. 1-249087

[51] Int. Cl.⁶ ................................................. G11C 5/06
[52] U.S. Cl. .......................................... 365/63; 365/51; 365/72; 365/208; 365/190; 365/210; 365/214; 365/230.06
[58] Field of Search ............... 365/51, 63, 149, 230.06, 365/207, 208, 72, 214, 190, 69, 210; 357/23.6

[56] References Cited

U.S. PATENT DOCUMENTS

| | | |
|---|---|---|
| 4,125,854 | 11/1978 | McKenney et al. |
| 4,476,547 | 10/1984 | Miyasaka ............................. 365/208 |
| 4,586,171 | 4/1986 | Fujishima . |
| 4,700,328 | 10/1987 | Burghard . |
| 4,733,374 | 3/1988 | Furuyama et al. . |
| 4,916,334 | 4/1990 | Minagawa et al. ............ 365/230.06 |
| 4,916,661 | 4/1990 | Nawaki et al. . |
| 4,941,031 | 7/1990 | Kumagai et al. .................. 357/23.6 |
| 4,977,542 | 12/1990 | Matsuda et al. . |
| 5,016,071 | 5/1991 | Kumagai et al. ...................... 365/63 |
| 5,097,441 | 3/1992 | Cho et al. ........................ 365/230.06 |
| 5,155,700 | 10/1992 | Min et al. . |

FOREIGN PATENT DOCUMENTS

| | | |
|---|---|---|
| 0055572 | 7/1982 | European Pat. Off. . |
| 55572A2 | 7/1982 | European Pat. Off. . |
| 61-274357 | 4/1986 | Japan . |
| 61-274357A | 12/1986 | Japan . |

Primary Examiner—Joseph E. Clawson, Jr.
Attorney, Agent, or Firm—Banner, Birch, McKie & Beckett

[57] ABSTRACT

According to this invention, a semiconductor apparatus includes a word line group consisting of four word lines, a bit line pair group, word line drive circuits, arrangement patterns of which are alternately inverted, for outputting boosted word line signals to the word line group, and memory contact portions provided to the bit line pair group in a ¼-pitch system, wherein output terminals of the word line drive circuit having an inverted arrangement pattern are connected to memory cells so as to be aligned in the same order as in output terminals of the word line drive circuit having a non-inverted arrangement pattern.

14 Claims, 10 Drawing Sheets

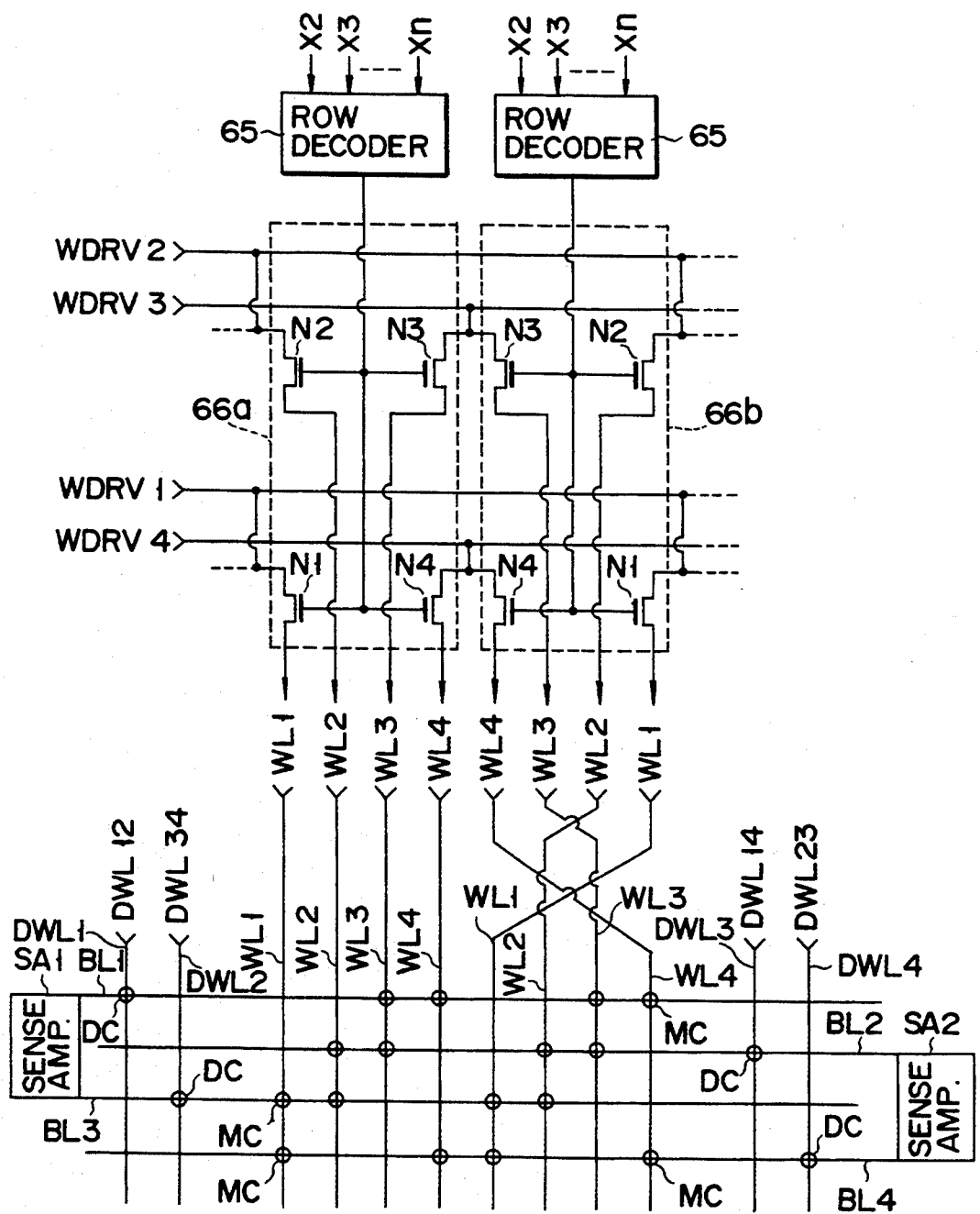
F I G. 9

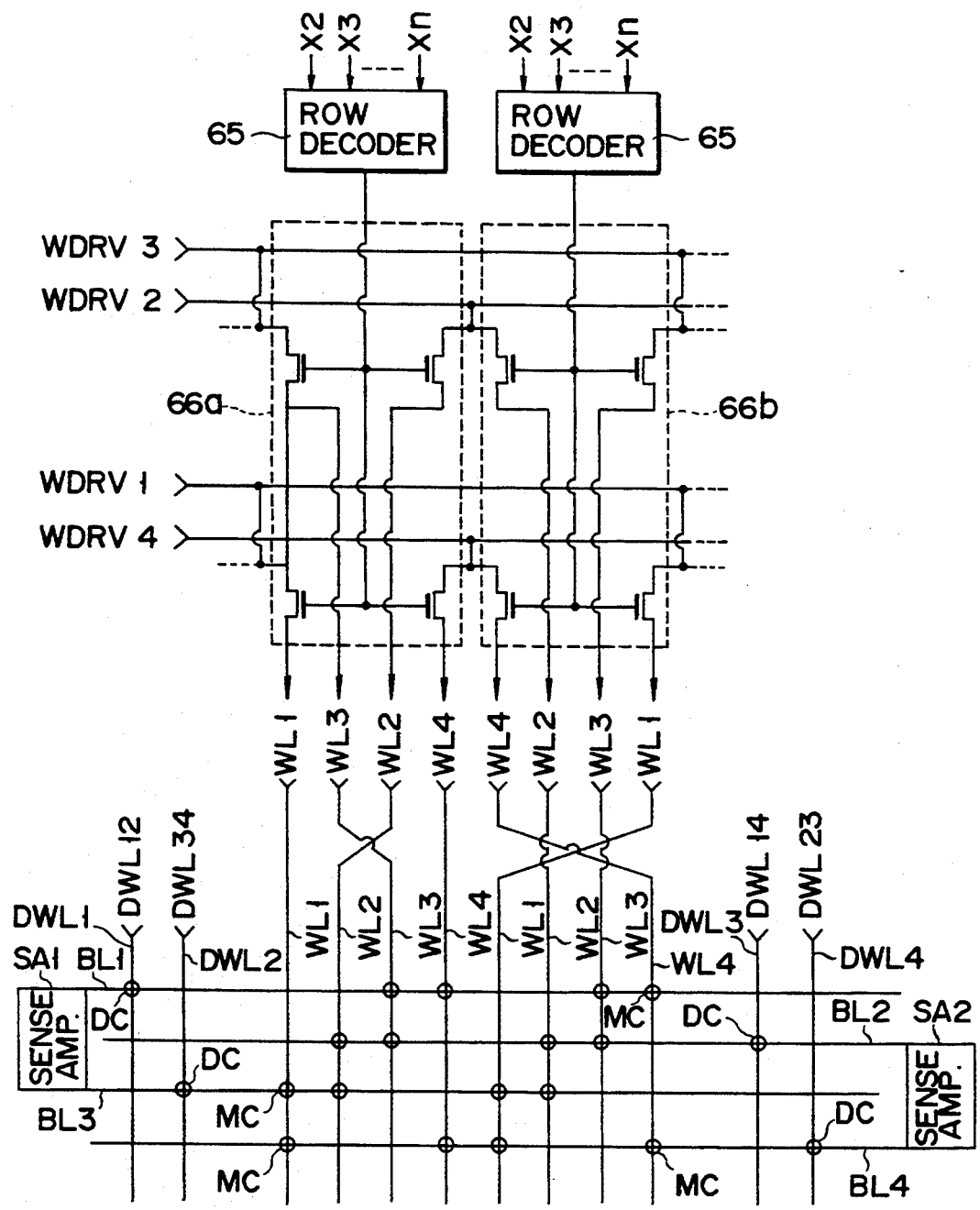
F I G. 11

SEMICONDUCTOR MEMORY APPARATUS WITH CONFIGURED WORD LINES TO REDUCE NOISE

This application is a continuation of application Ser. No. 08/048,213, filed Mar. 10, 1993, abandoned, which is a continuation of application Ser. No. 07/586,155, filed Sep. 21, 1990, abandoned.

BACKGROUND OF THE INVENTION

1. Field of the Invention

The present invention relates to a semiconductor memory apparatus and, more particularly, to a word line arrangement of a memory cell array in a ¼-pitch dynamic random access memory (to be referred to as a DRAM hereinafter).

2. Description of the Related Art

In a memory cell array in a conventional random access memory (to be referred to as a DRAM hereinafter), various arrangement patterns for obtaining high integration and a large capacity have been proposed. FIG. 1 schematically shows, as an example, a part of folded bit line type ½-pitch cell alignment pattern.

In FIG. 1, reference symbols $BL_1$ to $BL_4$ denote bit lines formed to be parallel to each other; MC denotes 1-transistor 1-capacitor memory cells; DC denotes dummy cells; WL1 to WL4 denote word lines; DWL14 and DWL23 denote dummy word lines; and $SA_1$ and $SA_2$ denote bit line sense amplifiers arranged on one side of a corresponding pair of the bit lines $BL_1$ to $BL_4$. The two adjacent bit lines ($BL_1$ and $BL_2$) and ($BL_3$ and $BL_4$) are complementarily paired to be connected to one of the bit line sense amplifiers $SA_1$ and $SA_2$.

With the cell alignment shown in FIG. 1, when the size of a memory cell is decreased in accordance with micropatterning of a semiconductor memory apparatus, a distance between openings of cell plate electrodes (capacitor plate electrodes) is decreased, thereby disconnecting the cell plate electrode. Therefore, in order to avoid the above problem, it is proposed that memory cells are arranged to be offset by a $\frac{1}{2^n}$ (n is a natural number of 2 or more) pitch in a direction of a channel length of a cell transistor (charge transferring transistor) (for example, Published Unexamined Japanese Patent Application No. 61-274357).

FIG. 2 schematically shows a ¼-pitch cell alignment pattern. In FIG. 2, reference symbols $BL_1$ to $BL_4$ denote bit lines formed to be parallel to each other; MC denotes 1-transistor 1-capacitor memory cells; DC denotes dummy cells; WL1 to WL4 denote word lines formed in a direction crossing the bit lines $BL_1$ to $BL_4$; DWL1 to DWL4 denote dummy word lines formed in a direction crossing the bit lines $BL_1$ to $BL_4$; and $SA_1$ and $SA_2$ denote bit line sense amplifiers arranged on both ends of the bit lines $BL_1$ to $BL_4$. The two bit lines ($BL_1$ and $BL_3$) and ($BL_2$ and $BL_4$) which sandwich one bit line are complementarily paired to be connected to one of the bit line sense amplifiers $SA_1$ and $SA_2$.

In the cell alignment pattern shown in FIG. 2, an element region for two transistors is formed to cross one bit line and two adjacent word lines. The drain (or source) of each of two cell transistors on the element region contacts the bit line at an intersection thereof. Regarding two arbitrary adjacent bit lines (e.g., $BL_1$ and $BL_2$), a memory contact portion of one bit line $BL_1$ is arranged to be offset by a ¼ pitch from the memory cell contact portion of the bit line $BL_2$ adjacent to the memory contact portion of the bit line $BL_1$ in a longitudinal direction of the bit line.

FIG. 3 is a plan view showing a part of the ¼-pitch cell alignment pattern shown in FIG. 2 in detail. Referring to FIG. 3, reference numerals 611 denote bit lines formed in parallel to each other, and reference numerals 622 denote bit line sense amplifiers arranged on both ends of the bit lines 611. As shown in FIG. 3, bit lines 611 are complementarily paired and each pair is connected to a corresponding sense amplifier 622. Furthermore, the first or second bit line of any one pair of bit lines is arranged between the first and second bit lines of another pair of bit lines. The bit lines 611 have contact portions 633 with the drains (or sources) of the cell transistors arranged in the longitudinal direction of the bit lines 611 at a predetermined pitch P. In this case, the transistor contact portion 633 of a given bit line 611 is offset from the transistor contact portion of an adjacent bit line 611 by a ¼ pitch in the longitudinal direction of the bit lines.

FIG. 4 shows a sectional structure of a memory cell region obtained when a ¼-pitch cell alignment pattern is employed. In FIG. 4, denotes reference numeral 411 denotes a semiconductor substrate; 422, an element isolating field oxide film selectively formed on the substrate; 433 and 444 denote source regions of first and second cell transistors consisting of a diffusion layer of a conductivity type opposite to that of the substrate; 455 denotes a common drain region of the two cell transistors consisting of a diffusion layer of a conductivity type opposite to that of the substrate; and 466 and 477, gate electrodes of the first and second cell transistors which are formed on the substrate 411 through thin gate insulating films 488 and which are parts of word lines 722. Reference numeral 499 denotes a first insulating interlayer; 611, the bit lines; and 633, the transistor contact portions. The transistor contact portions contact the drain region 455 through contact holes. Reference numerals 722 denote the word lines; and 500, a second insulating interlayer.

Charge storing capacitors are respectively connected to the two cell transistors. That is, reference numerals 733 denote capacitor storing electrodes, and they are partially formed on the second insulating interlayer 500 on the upper side of parts of the bit lines 611 and contact the source regions 433 or 444 of the cell transistors through contact holes. A capacitor plate electrode 522 is formed opposite to each capacitor storing electrode 733 through a capacitor insulating film 511 having a thin part. Thus, a stacked capacitor is formed.

FIG. 5 shows a part of a conventional word line drive system in the above ¼ pitch DRAM. In FIG. 5, reference numeral 61 denotes a boosted word line potential generating circuit for generating a word line signal WDRV boosted to a predetermined value of a power source potential or more, and reference numeral 62 denotes a predecoder for predecoding 2 bits $X_0$ and $X_1$ of a row address signal and selectively outputting four boosted word line signals WDRV1 to WDRV4. The predecoder comprises a predecoding gate circuit group 63 and a MOS transistor group 64 controlled in response to an output from the gate circuit group 63 to be an ON state so as to pass the boosted word line signal WDRV from the boosted word line signal generating circuit. Reference numeral 65 denotes a row decoder for decoding remaining bits $X_2$ to $X_n$ of the row address signals; and 66, a word line drive circuit for outputting the boosted word line signals WDRV1 to WDRV4 to corresponding word lines WL1 to WL4 in response to an output from the row decoder 65. The word line drive circuit 66 comprises a MOS transistor group 67 controlled to be an ON state in response to the output from the row decoder 65 so as to pass the boosted word line signals WDRV1 to WDRV4 from the MOS transistor group 64 of the predecoder 62.

Note that, when the word lines WL1 to WL4 have large parasitic capacitances, the rise time of the word line potential is delayed. Therefore, the boosted word line signals WDRV1 to WDRV4 are used to prevent the above phenomenon.

As the size of a memory cell of the semiconductor memory apparatus is decreased, pitches between the word lines WL1 to WL4 are decreased. Each pattern pitch of the row decoder 65 and the word line drive circuit 66 for selecting the word lines WL1 to WL4 is hard to be increased. Under the above condition, when the row decoder 65 group and the word line drive circuit 66 group are to be aligned, in order to repeatedly arrange the pattern of the word line drive circuits 66 in the same repetition (non-inverted repetition) pattern in a direction of the alignment of the word lines, transistors of the word line drive circuits 66 must be electrically isolated from each other by element isolation. Therefore, the pattern of the word line drive circuit 66 is too large, thereby increasing the chip size.

As shown in FIG. 6, in order to prevent an increase in chip size, patterns of the word line drive circuits must be arranged such that every other word line drive circuit patterns are repeatedly inverted in the direction of the alignment of the word lines (a normal word line drive circuit is represented by 66a, and a pattern-inverted word line drive circuit is represented by 66b).

In the repeatedly inverted pattern, the source of a word line drive transistor selected by the word line drive circuit 66a or 66b and the source of a word line drive transistor selected by the adjacent word line drive circuit 66b or 66a are commonly used. That is, four MOS transistors N1 to N4 in each of the word line drive circuits 66a and 66b are arranged at upper right, upper left, lower right, and lower left positions in the pattern surface, respectively, and sources of these MOS transistors and sources of MOS transistors of the word line drive circuit adjacent to the word line drive circuits 66a and 66b are commonly formed to be connected to any one of the boosted word line signals WDRV1 to WDRV4.

With the above repeatedly inverted pattern, alignment of the word lines WL1 to WL4 determined by the boosted word line signals WDRV1 to WDRV4 is repeatedly inverted in units of word line drive circuits. For example, the word lines are repeatedly aligned in an order of WL1→WL2→WL3→WL4→WL5→WL4→WL3→WL2→WL1.

In this case, a connecting relationship between the word lines WL1 to WL4 connected to the two adjacent word line drive circuits 66a and 66b and memory cells connected to two pairs of every two bit lines in ¼-pitch system is different from that in a ½ pitch system. That is, in the ¼-pitch cell alignment pattern, word lines (WL1 and WL2) connected to the word line drive circuit 66a and word lines (WL4 and WL3) connected to the word line drive circuit 66b are connected to memory cells MC connected to a bit $BL_3$ of one bit line pair, and word lines (WL3 and WL4) connected to the word line drive circuit 66a and word lines (WL2 and WL1) connected to the word line drive circuit 66b are connected to memory cells MC connected to a bit line $BL_1$ of one bit line pair. Word lines (WL2 and WL3) connected to the word line drive circuit 66a and word lines (WL3 and WL2) connected to the word line drive circuit 66b are connected to memory cells MC connected to a bit line $BL_2$ of the other bit line pair, and word lines (WL1 and WL4) connected to the word line drive circuit 66a and word lines (WL4 and WL1) connected to the word line drive circuit 66b are connected to memory cells MC connected to a bit line $BL_4$ of the other bit line pair.

On the contrary, in the ½-pitch cell alignment pattern, as shown in FIG. 1, word lines (WL1 and WL4) connected to each word line drive circuit are connected to memory cells MC connected to one bit line $BL_1$ or $BL_3$ of each pair of bit lines, and word lines (WL2 and WL3) connected to each word line drive circuit are connected to memory cells MC connected to the other bit line $BL_2$ or $BL_4$ of each pair of bit lines. That is, the word lines WL1 to WL4 of each word line drive circuit are repeatedly formed in the same pattern and connected to the memory cells MC in the same pattern.

When the above arrangement of the word lines is employed, as a dummy word line drive circuit for selecting dummy cells DC connected to the other bit line paired with one bit line to which memory cells selected by a selection word line is connected, an arrangement shown in FIG. 7 is used in the ½-pitch DRAM, and an arrangement shown in FIG. 8 is used in the ¼-pitch DRAM.

That is, in a dummy word line drive circuit of a ½-pitch DRAM has the following arrangement. As shown in FIG. 7, one bit $X_0$ of a row address signal and a boosted word line signal WDRV are logically processed by a logic circuit 81, and a dummy word line drive signal DWL14 is output during selection of the word line WL1 or WL4. A dummy word line drive signal DWL23 is output during selection of the word line WL2 or WL3.

A dummy word line drive circuit in a ¼-pitch DRAM, as shown in FIG. 8, comprises a predecoder (not shown) for predecoding 2 bits $X_0$ and $X_1$ of a row address signal and selectively outputting four word line signals WDRV1 to WDRV4 and a logic circuit 91 for selectively outputting four dummy word line drive signals DWLa to DWLd in response to a row address signal (1 bit Xi of signals X2 to Xn input to the row decoder 65) for checking whether the pattern of the word line drive circuit used to select word lines is inverted or not. This logic circuit 91 comprises eight gate circuits 921 to 928 each for ORing two predetermined signals of the four boosted word line signals WDRV1 to WDRV4, four MOS transistors 931 to 934 controlled in an ON state by the 1-bit row address signal Xi to cause outputs from the four gate circuits of the eight gate circuits 921 to 928 to pass, and four MOS transistors 935 to 938 controlled in an ON state by an inverted signal $\overline{X_i}$ of the 1-bit row address signal Xi to cause outputs from the remaining four of eight gate circuits 921 to 928 to pass. Output terminals of the four MOS transistors 935 to 938 are wired-ORed to the output terminals of the MOS transistors 931 to 934 respectively.

Although the dummy word line drive circuit shown in FIG. 7 in the above ½-pitch DRAM has a simple arrangement, the dummy word line drive circuit in the ¼-pitch DRAM is required to have a large number of circuit elements. A pattern area for the dummy word line drive circuit in which the pattern is repeated proportionally to the number of memory cell arrays is largely increased, thereby increasing the chip size. In addition, when dummy word line selection logic is complicated, the operational speed of the memory is adversely affected.

As described above, in a conventional $\frac{1}{4}$-pitch DRAM, when the word line drive circuits are arranged such that every other word line drive circuit pattern is repeatedly inverted, logical processing for checking whether the pattern of the word line drive circuit used to select word lines is inverted or not must be performed by a dummy word line drive circuit. Therefore, since the dummy word line drive circuit is required to have a large number of circuit elements, the chip size is increased, and the dummy word line selection logic is complicated. The operational speed of the memory is undesirably decreased.

SUMMARY OF THE INVENTION

It is an object of the present invention to provide a semiconductor memory apparatus capable of simplifying an arrangement of a dummy word line drive circuit, suppressing an increase in chip size, and increasing an operational speed of a memory.

According to the present invention, there is provided a semiconductor apparatus comprising:
- a word line group consisting of four word lines arranged at a predetermined interval;
- a bit line pair group each pair of which are parallelly arranged in a direction perpendicular to the word lines and formed by every two bit lines;
- a bit line sense amplifier connected to the bit line pair;
- a plurality of word line drive circuits, arrangement patterns of which are alternately inverted, for outputting boosted word line signals to the word line group; and
- a plurality of memory cell contact portions which are formed on the bit lines alternately arranged in a longitudinal direction of the bit lines so as to be offset by every $\frac{1}{4}$ pitch;
wherein output terminals of the word line drive circuit having an inverted arrangement pattern are connected to memory cells so as to be aligned in the same order as in output terminals of the word line drive circuit having a non-inverted arrangement pattern.

According to the present invention, even when word line drive circuits are arranged such that every two word line drive circuit patterns are repeatedly inverted in the aligning direction of word lines, the same alignment of the word lines is obtained as in a case wherein the word line drive circuits are arranged in the same repetition pattern (non-inverting repetition) as that of the word lines in the alignment direction of word lines. Since word lines of each word line drive circuit are repeatedly formed in the same pattern and connected to memory cells in the same pattern, the arrangement of dummy word line drive circuit and a dummy word line selection logic are simplified.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a circuit diagram showing a case wherein a word line drive circuit and a memory cell array are connected to each other by crossing word lines in a semiconductor apparatus according to the present invention;

FIG. 11 is a circuit diagram showing a semiconductor apparatus according to another embodiment of the present invention.

DETAILED DESCRIPTION OF THE PREFERRED EMBODIMENTS

Embodiments of the present invention will be described below with reference to the accompanying drawings.

Figure 1:
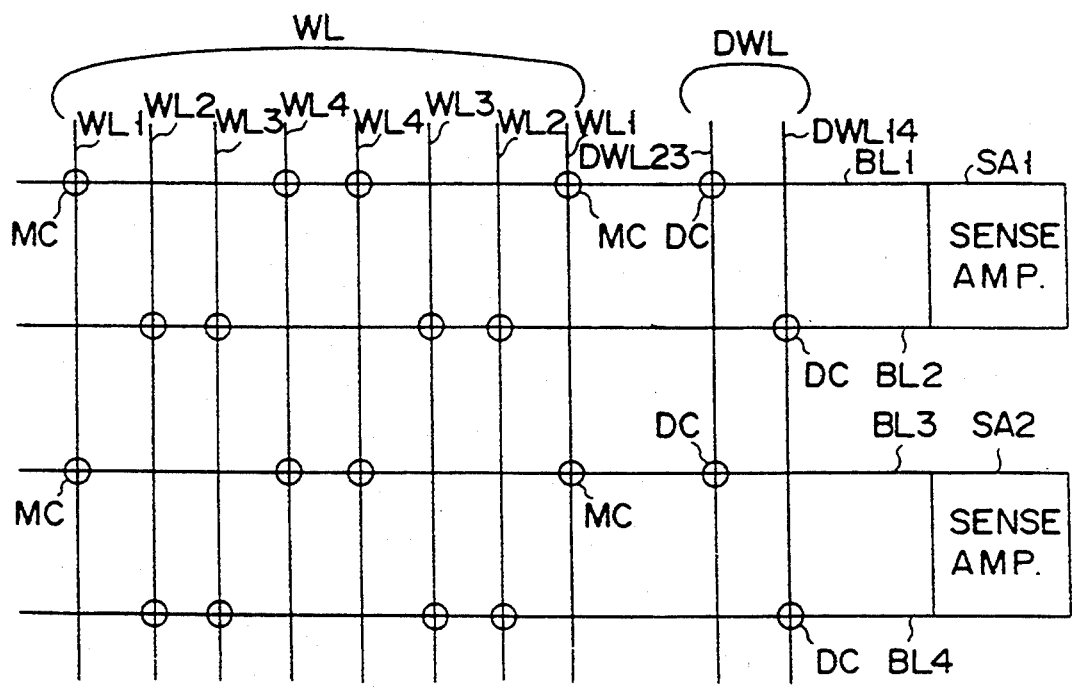
FIG. 1 is a schematic view showing a part of a $\frac{1}{2}$-pitch cell alignment pattern.
Figure 2:
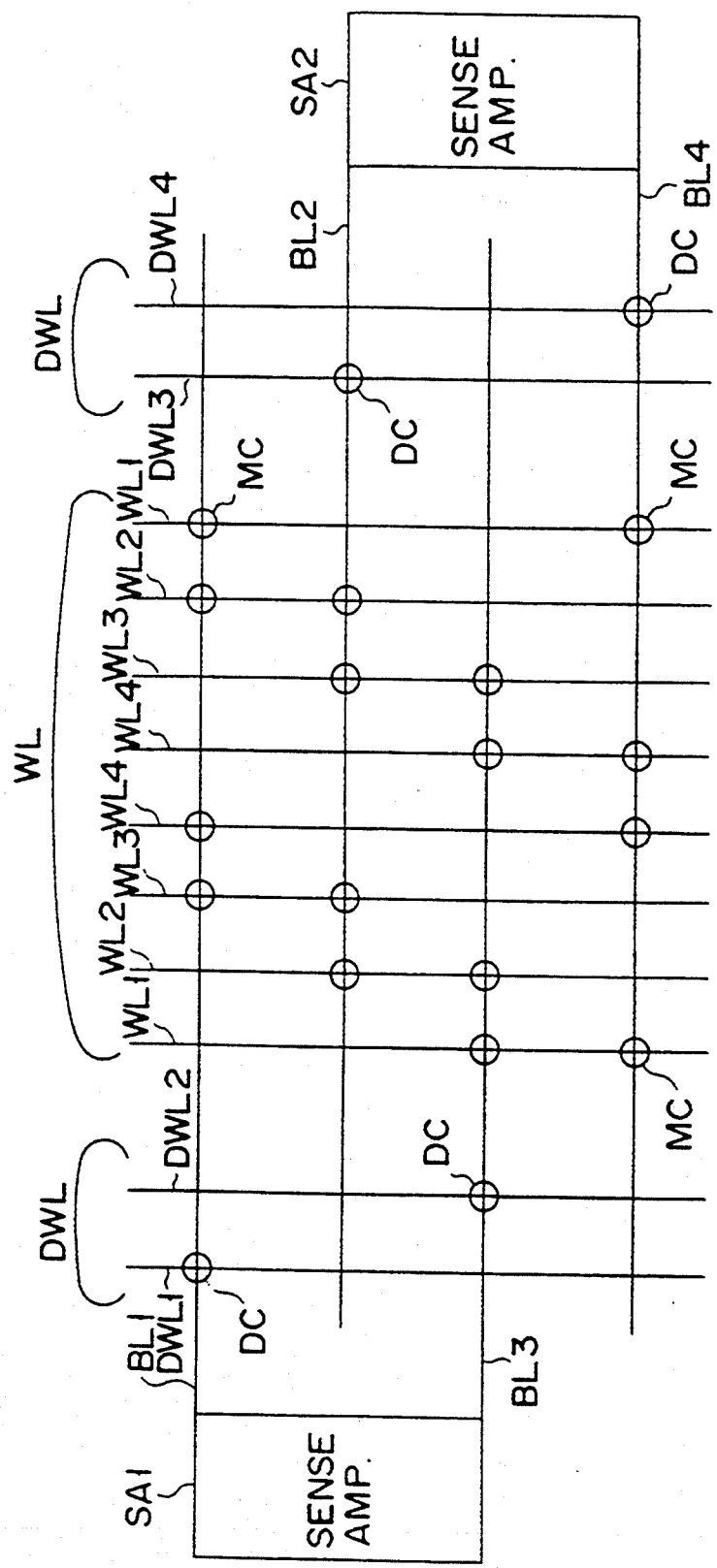
FIG. 2 is a schematic view showing a part of a $\frac{1}{4}$-pitch cell alignment pattern.
Figure 3:
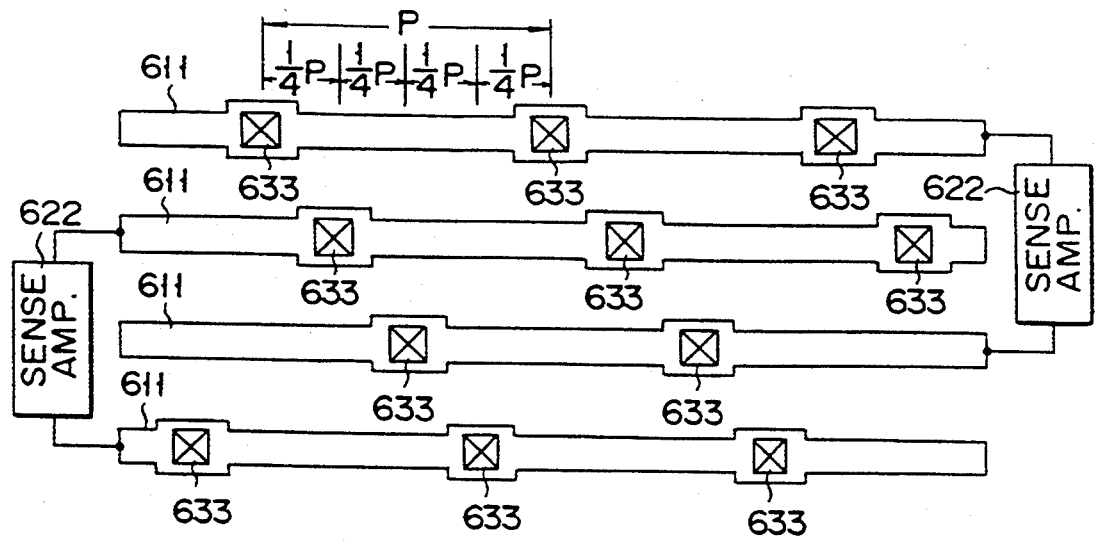
FIG. 3 is a plan view showing the $\frac{1}{4}$-pitch cell alignment pattern in detail.
Figure 4:
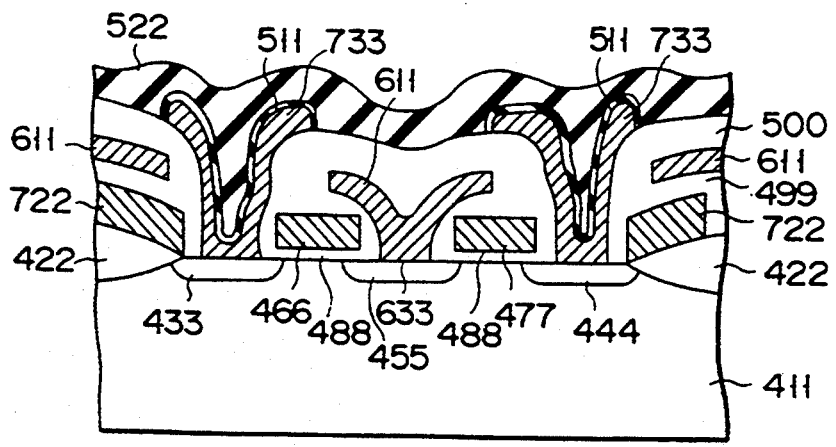
FIG. 4 is a sectional view showing a memory cell in which a $\frac{1}{4}$-pitch cell alignment pattern is employed.
Figure 5:
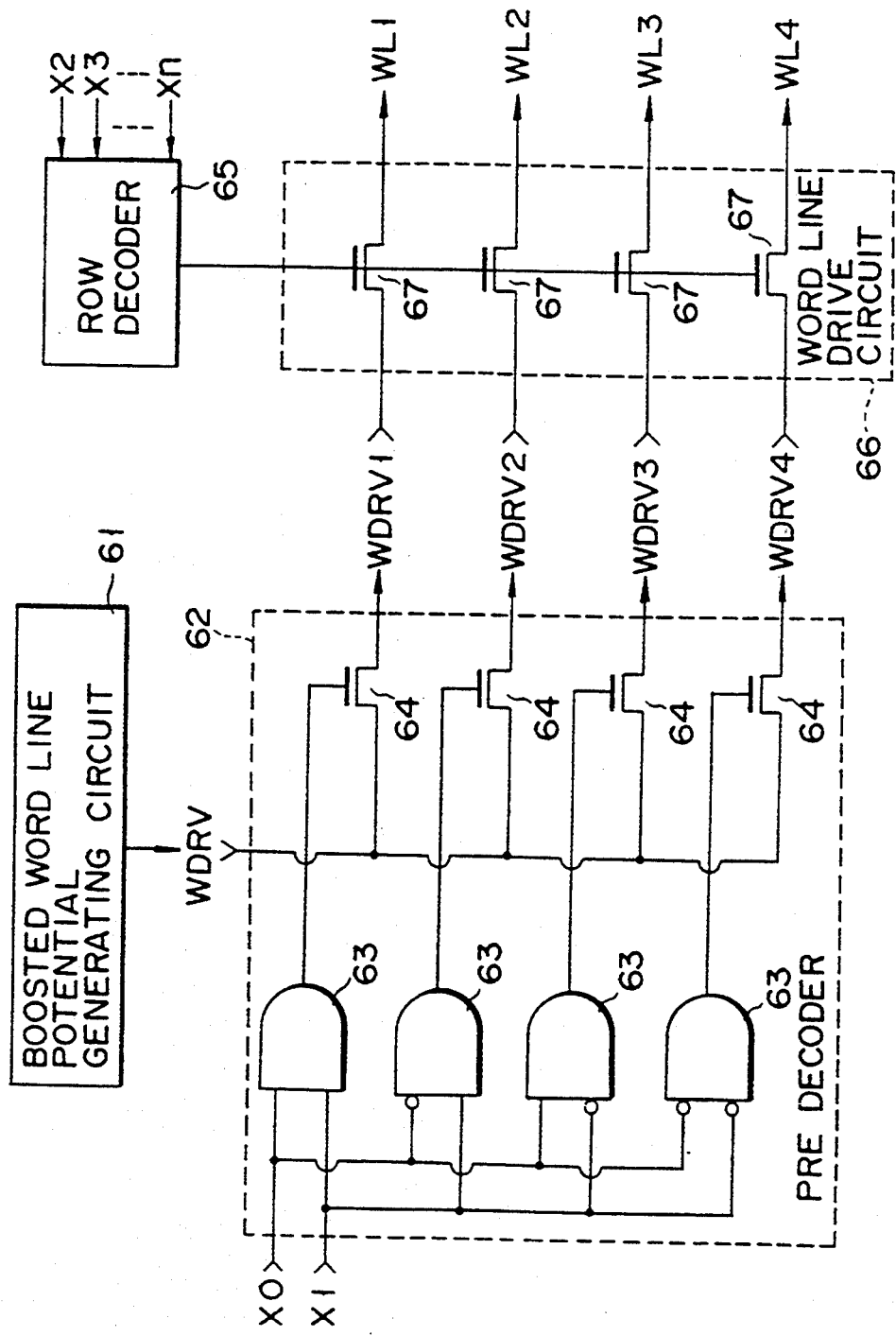
FIG. 5 is a view showing a part of a conventional word line drive system in a DRAM in which the $\frac{1}{4}$-pitch cell alignment pattern shown in FIG. 2 is employed.
Figure 6:
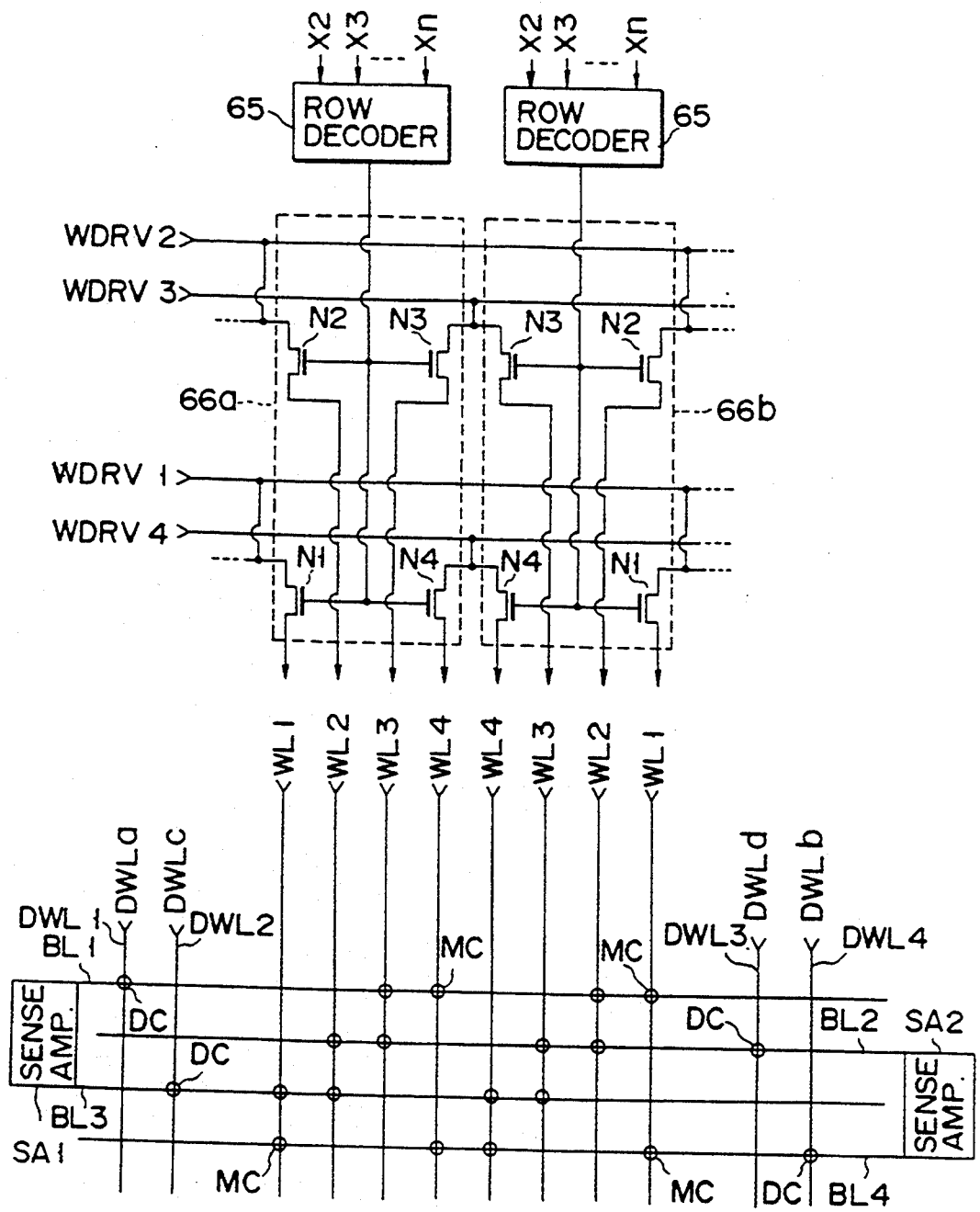
FIG. 6 is a sectional view showing word line drive circuits which are arranged such that every other alignment pattern of the word line drive circuit is inverted and which is connected to a $\frac{1}{4}$-pitch alignment pattern.
Figure 7:
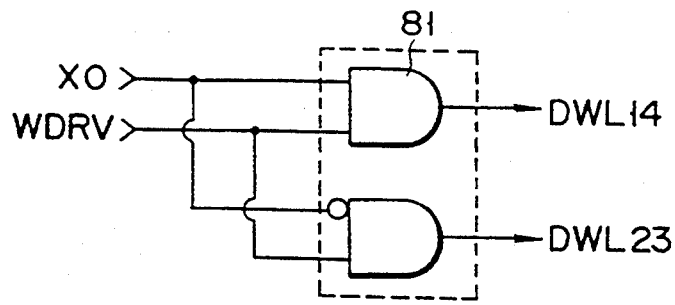
FIG. 7 is a circuit diagram showing a dummy word line drive circuit for driving dummy word line of a $\frac{1}{2}$-pitch cell alignment pattern.
Figure 8:
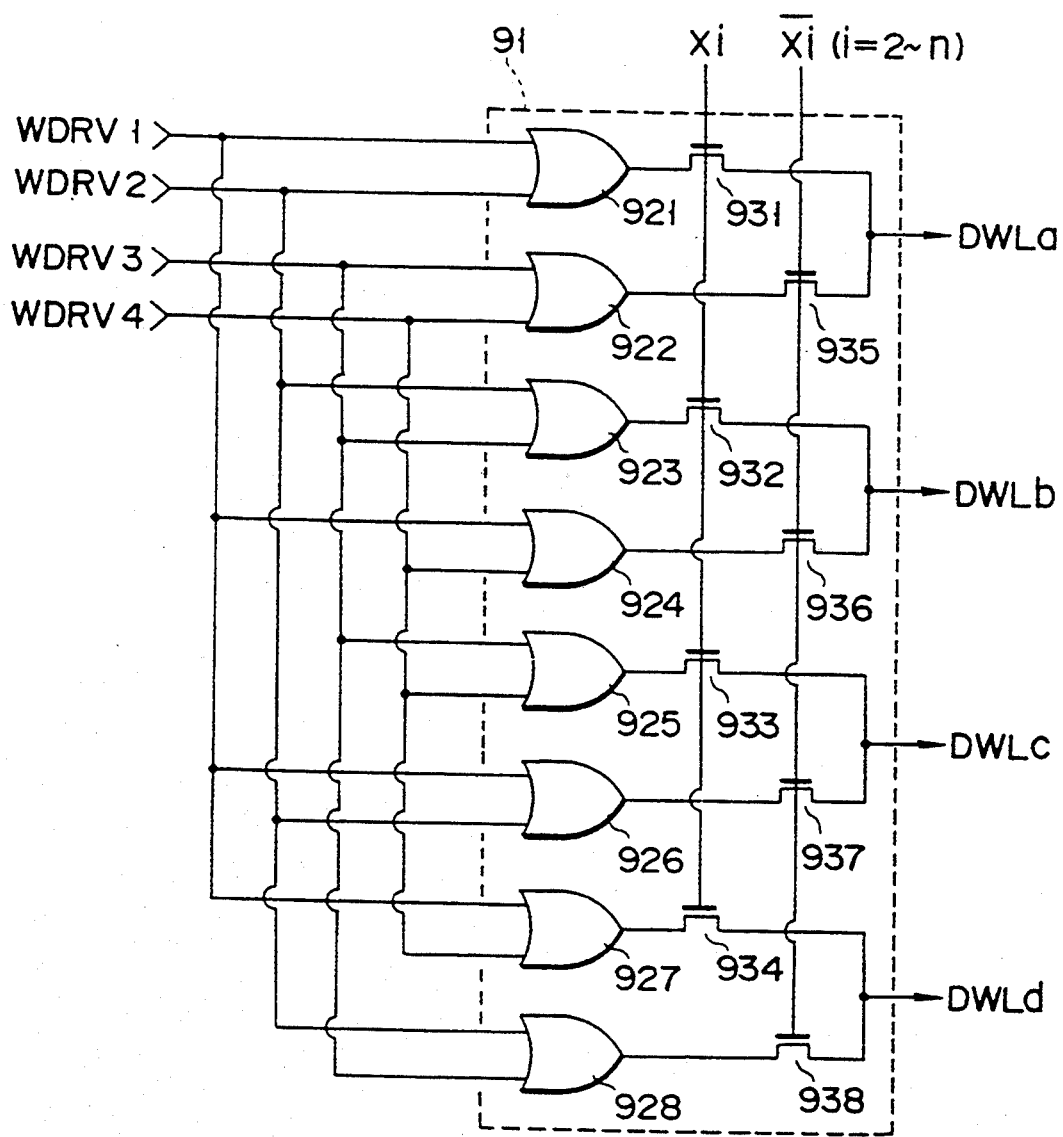
FIG. 8 is a circuit diagram showing a dummy word line drive circuit for driving dummy word line of a $\frac{1}{4}$-pitch cell alignment pattern.

FIG. 9 shows a part of a memory cell array in a $\frac{1}{4}$-pitch DRAM and a part of a word line drive system. Unlike a word line drive system in a conventional $\frac{1}{4}$-pitch DRAM described above with reference to FIG. 6, word lines WL4 to WL1 are formed between the output terminal of a word line drive circuit 66b having an inverted pattern and the memory cell array, such that the word lines WL4 and WL1 of the word lines WL4 and WL1 are three-dimensionally crossed to each other and the word lines WL2 and WL3 are three-dimensionally crossed to each other. Thus, the word lines in the memory cell array are repeatedly aligned in an order of WL1→WL2→WL3→WL4→WL1→WL2→WL3→WL4. Other arrangements are the same as those of the word drive system in FIG. 6. Therefore, the same reference numerals as in FIG. 6 denote the same parts in FIG. 9.

That is, the DRAM in FIG. 9 comprises a memory cell array in which 1-transistor 1-capacitor memory cells are arranged such that a contact portion with a bit line is offset from a memory cell contact portion of the adjacent bit line in a longitudinal direction of the bit line by a $\frac{1}{4}$ pitch. In a $\frac{1}{4}$-pitch DRAM in which four word lines WL1 to WL4 selected in four ways by a combination of two bits $X_0$ and $X_1$ of a row address signal are aligned adjacent to each other, word lines selected by the same combination of the bits $X_0$ and $X_1$ as described above are repeatedly aligned every four bit lines.

According to the DRAM, although every other word line drive circuit pattern is is inverted in the alignment direction of word lines, the word lines WL1 to WL4 have the same arrangement as in a case wherein the word line drive circuits are arranged in the same repetition pattern (non-inverting repetition) as that of the word lines in the aligning direction of word lines. The word lines WL1 to WL4 of each of word line drive circuits 66a and 66b are repeatedly formed in the same pattern and connected to memory cells MC. Therefore, a dummy word line drive circuit has a simple arrangement shown in FIG. 10, and a dummy word line selection logic is simplified.

Figure 10:
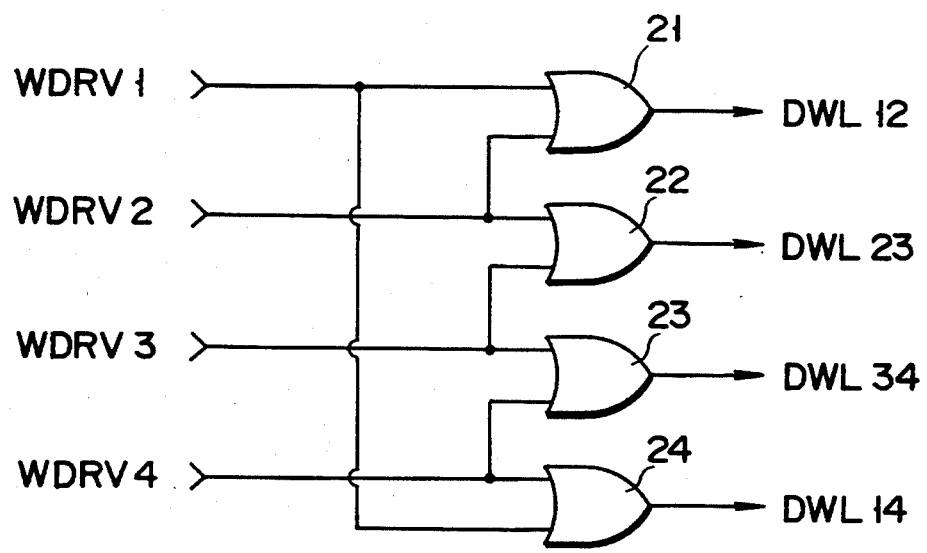
FIG. 10 is a circuit diagram showing a dummy word line drive circuit of the semiconductor apparatus shown in FIG. 9.

The dummy word line drive circuit shown in FIG. 10 is arranged as follows. That is, four boosted word line signals WDRV1 to WDRV4 are logically processed by four OR circuits 21 to 24, and a dummy word line drive signal DWL12 is output in response to selection of the word line WL1 or WL2. A dummy word line drive signal DWL23 is output in response to selection of dummy word line WL2 or WL3, and a dummy word line drive signal DWL34 is output in response to selection of word line WL3 or WL4. A dummy word line drive signal DWL14 is output in response to selection of word line WL1 or WL4.

Figure 12:
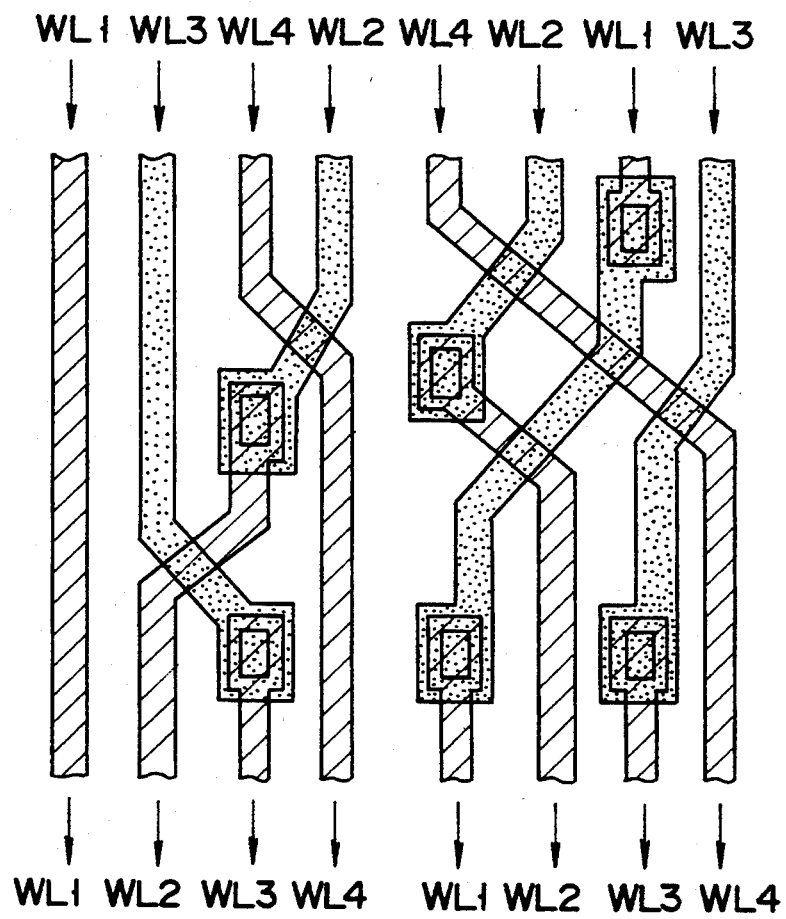
FIG. 12 is a plan view showing the crossed state of the word lines according to embodiment shown in FIG. 11.

In the embodiment in FIG. 9, word lines WL4 and WL1 of the word lines WL4 to WL1 connected to the word line drive circuit having an inverted pattern are three-dimensionally crossed, and the remaining word lines WL3 and WL2 are three-dimensionally crossed. However, the arrangement of the word lines is not limited in the above arrangement. That is, as shown in FIG. 11, inputs of boosted word line signals WDRV2 and WDRV3 to the word line drive circuit may be reversed to each other, and the word lines WL2 and WL3 connected to the word line drive circuit 66a having a non-inverted pattern may be three-dimensionally crossed. At the same time, the word lines WL4 and WL1 connected to the word line drive circuit 66b having an inverted pattern may be three-dimensionally crossed. In this case, in outputs of the word line drive circuits 66a and 66b, word lines are repeatedly aligned in an order of WL1→WL3→WL2→WL4→WL1→WL3→WL2→WL4. However, after the the word lines are crossed, the word lines are repeatedly aligned in an order of WL1→WL2→WL3→WL4→WL1→WL2→WL3→WL4. The same reference numerals in FIG. 11 denote the same parts as in FIG. 9. FIG. 12 is a plan view showing the crossed state of the word lines according to the embodiment shown in FIG. 11.

In the above embodiment shown in FIG. 11, some of word lines are three-dimensionally crossed to be repeatedly aligned in an order of WL1→WL2→WL3→WL4→WL1→WL2→WL3→WL4. However, even when the word lines are repeatedly aligned in an order of WL1→WL2→WL3→WL4→WL1→WL2→WL3→WL4 without three-dimensionally crossing some of word lines WL1 to WL4, the same effect as described above can be obtained.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
    a memory cell array having a plurality of memory cells arranged in pairs on a substrate and having a contact between each pair of memory cells;
    a plurality of bit lines arranged on said substrate, each of said bit lines being coupled to a plurality of said memory cell contacts, successive contacts of any one of said bit lines being separated by a predetermined pitch, and the contacts of a first bit line being shifted by approximately ¼ pitch along the bit line direction from the contacts of a second adjacent bit line;
    a plurality of dummy cells formed in said memory cell array;
    a plurality of sense amplifiers arranged on said substrate, each sense amplifier being coupled to a pair of said bit lines;
    a first group of at least four word lines intersecting said bit lines at a first region in said memory cell array;
    a second group of at least four word lines intersecting said bit lines at a second region in said memory cell array, the at least four word lines of said second group being arranged in the same order as the least four word lines of said first group; and
    word line drive circuitry for supplying drive potentials to the at least four word lines of said first and second groups, comprising,
        first input drive line circuitry having a plurality of output terminals arranged in a first order for coupling said word line drive circuitry to said first group of at least four word lines in said memory cell array; and
        second input drive line circuitry having a plurality of output terminals arranged in a second order inverse to said first order for coupling said word line drive circuitry to said second group of at least four word lines in said memory cell array.

2. A semiconductor memory device according to claim 1, wherein each of said sense amplifiers is coupled to two non-adjacent bit lines.

3. A semiconductor memory device comprising:
    a plurality of sense amplifiers arranged on a substrate;
    a plurality of bit line pairs arranged on said substrate, each bit line pair having first and second bit lines coupled to one of said sense amplifiers;
    a plurality of memory cells arranged in pairs on said substrate and having a contact between each pair of memory cells, said contact coupled to one of said bit lines;
    a first word line group intersecting said bit line pairs at a first intersection region on said substrate, said first word line group having first, second, third and fourth word lines wherein, at said first intersection region, said second word line is between said first and third word lines, and said third word line is between said second and fourth word lines;
    a second word line group intersecting said bit line pairs at a second intersection region on said substrate, said second word line group having fifth, sixth, seventh and eighth word lines wherein, at said second intersection region, said fifth word line is between said fourth and sixth word lines, said sixth word line is between said fifth and seventh word lines and said seventh word line is between said sixth and eighth word lines;

word line drive circuitry arranged in a first pattern, and having first, second, third and fourth output terminals wherein, on a substrate, said second output terminal is between said first and third output terminals, and said third output terminal is between said second and fourth output terminals, and wherein said first output terminal supplies said first word line with a drive potential, said second output terminal supplies said second word line with a drive potential, said third output terminal supplies said third word line with a drive potential and said fourth output terminal supplies said fourth word line with a drive potential; and word line drive circuitry arranged in a second pattern, and having fifth, sixth, seventh and eighth output terminals wherein, on a substrate, said fifth output terminal is between said fourth and sixth output terminals, said sixth output terminal is between said fifth and seventh output terminals and said seventh output terminal is between said sixth and eighth output terminals, and wherein said fifth output terminal supplies said eighth word line with a drive potential, said sixth output terminal supplies said seventh word line with a drive potential, said seventh output terminal supplies said sixth word line with a drive potential and said eighth output terminal supplies said fifth word line with a drive potential.

4. A semiconductor memory device according to claim 3, wherein each of said sense amplifiers is coupled to two non-adjacent bit lines.

5. A semiconductor memory device according to claim 3, wherein successive contacts of any one of said bit lines are separated by a predetermined pitch, and the contacts of a first bit line are shifted by approximately ¼ pitch along the bit line direction from contacts of a second adjacent bit line.

6. A semiconductor memory device comprising:
a plurality of sense amplifiers arranged on a substrate;
a plurality of bit line pairs arranged on said substrate, each bit line pair having first and second bit lines coupled to one of said sense amplifiers;
a plurality of memory cells arranged in pairs on said substrate and having a contact between each pair of memory cells, said contact coupled to one of said bit lines;
a first word line group intersecting said bit line pairs at a first intersection region on said substrate, said first word line group having first, second, third and fourth word lines wherein, at said first intersection region, said second word line is between said first and third word lines, and said third word line is between said second and fourth word lines;
a second word line group intersecting said bit line pairs at a second intersection region on said substrate, said second word line group having fifth, sixth, seventh and eighth word lines wherein, at said second intersection region, said fifth word line is between said fourth and sixth word lines, said sixth word line is between said fifth and seventh word lines and said seventh word line is between said sixth and eighth word lines;
word line drive circuitry arranged in a first pattern, and having first, second, third and fourth output terminals wherein, on a substrate, said second output terminal is between said first and third output terminals, and said third output terminal is between said second and fourth output terminals, and wherein said first output terminal supplies said first word line with a drive potential, said second output terminal supplies said third word line with a drive potential, said third output terminal supplies said second word line with a drive potential and said fourth output terminal supplies said fourth word line with a drive potential; and
word line drive circuitry arranged in a second pattern, and having fifth, sixth, seventh and eighth output terminals wherein, on a substrate, said fifth output terminal is between said fourth and sixth output terminals, said sixth output terminal is between said fifth and seventh output terminals and said seventh output terminal is between said sixth and eighth output terminals, and wherein said fifth output terminal supplies said eighth word line with a drive potential, said sixth output terminal supplies said sixth word line with a drive potential, said seventh output terminal supplies said seventh word line with a drive potential and said eighth output terminal supplies said fifth word line with a drive potential.

7. A semiconductor memory device according to claim 6, wherein each of said sense amplifiers is coupled to two non-adjacent bit lines.

8. A semiconductor memory device according to claim 6, wherein successive contacts of any one of said bit lines are separated by a predetermined pitch, and the contacts of a first bit line are shifted by approximately ¼ pitch along the bit line direction from contacts of a second adjacent bit line.

9. A semiconductor memory device comprising:
first to eighth word lines;
first to fourth bit lines;
a first sense amplifier connected to the first bit line and the third bit line;
a second sense amplifier connected to the second bit line and the fourth bit line;
first to fourth word line signal lines, one of which is driven by an output from a predecoder;
a first word line drive circuit comprising first to fourth MOS transistors, for driving the first to fourth word lines;
a second word line drive circuit comprising fifth to eighth MOS transistors, for driving the fifth to eighth word lines;
first to fourth dummy word lines, the first dummy word line being driven by output signals from the first and second word line signal lines, the second dummy word line being driven by output signals from the second and third word line signal lines, the third dummy word line being driven by output signals from the third and fourth word line signal lines, and the fourth dummy word line being driven by output signals from the fourth and first word line signal lines;
a first group of memory cells comprising memory cells, respectively, disposed at the crossings between said first bit line and said third, fourth, seventh and eighth word lines;
a second group of memory cells comprising memory cells, respectively, disposed at the crossings between said second bit line and said second, third, sixth and seventh word lines;
a third group of memory cells comprising memory cells, respectively, disposed at the crossings between said third bit line and said first, second, fifth and sixth word lines;

a fourth group of memory cells comprising memory cells, respectively, disposed at the crossings between said fourth bit line and said first, fourth, fifth and eighth word lines;

a first dummy cell disposed at the crossing between said first bit line and said first dummy word line;

a second dummy cell disposed at the crossing between said second bit line and said fourth dummy word line;

a third dummy cell disposed at the crossing between said third bit line and said third dummy word line; and a fourth dummy cell disposed at the crossing between said fourth bit line and said second dummy word line;

wherein said first MOS transistor of said first word line drive circuit connects said first word line signal line to said first word line, said second MOS transistor of said first word line drive circuit connects said second word line signal line to said second word line, said third MOS transistor of said first word line drive circuit connects said third word line signal line to said third word line, and said fourth MOS transistor of said first word line drive circuit connects said fourth word line signal line to said fourth word line, said fifth MOS transistor of said second word line drive circuit connects said first word line signal line to said fifth word line, said sixth MOS transistor of said second word line drive circuit connects said second word line signal line to said sixth word line, said seventh MOS transistor of said second word line drive circuit connects said third word line signal line to said seventh word line, and said eighth MOS transistor of said second word line drive circuit connects said fourth word line signal line to said eighth word line, and drains of said third and seventh MOS transistors are connected to said third word line signal line and drains of said fourth and eighth MOS transistors are connected to said fourth word line signal line.

10. The device according to claim 9, wherein said word lines and said MOS transistors are connected to each other by at least a plurality of layers.

11. The device according to claim 9, wherein said memory cells each include a stacked type capacitor.

12. A semiconductor memory device comprising:

first to eighth word lines;

first to fourth bit lines;

a first sense amplifier connected to the first bit line and the third bit line;

a second sense amplifier connected to the second bit line and the fourth bit line;

first to fourth word line signal lines, one of which is driven by an output from a predecoder;

a first word line drive circuit comprising first to fourth MOS transistors, for driving the first to fourth word lines;

a second word line drive circuit comprising fifth to eighth MOS transistors, for driving the fifth to eighth word lines;

a first group of memory cells comprising memory cells, respectively, disposed at the crossings between said first bit line and said third, fourth, seventh and eighth word lines;

a second group of memory cells comprising memory cells, respectively, disposed at the crossings between said second bit line and said second, third, sixth, and seventh word lines;

a third group of memory cells comprising memory cells, respectively, disposed at the crossings between said third bit line and said first, second, fifth and sixth word lines;

a fourth group of memory cells comprising memory cells, respectively, disposed at the crossings between said fourth bit line and said first, fourth, fifth and eighth word lines;

wherein said first MOS transistor of said first word line drive circuit connects said first word line signal line to said first word line, said second MOS transistor of said first word line drive circuit connects said second word line signal line to said second word line, said third MOS transistor of said first word line drive circuit connects said third word line signal line to said third word line and said fourth MOS transistor of said first word line drive circuit connects said fourth word line signal line to said fourth word line, said fifth MOS transistor of said second word line drive circuit connects said first word line signal line to said fifth word line, said sixth MOS transistor of said second word line drive circuit connects said second word line signal line to said sixth word line, said seventh MOS transistor of said second word line drive circuit connects said third word line signal line to said seventh word line, and said eighth MOS transistor of said second word line drive circuit connects said fourth word line signal line to said eighth word line, drains of said third and seventh MOS transistors are connected to said third word line signal line and drains of said fourth and eighth MOS transistors are connected to said fourth word line signal line, and said first and second word line drive circuits are alternatively selected by outputs from a row decoder.

13. The device according to claim 12, wherein said word lines and said MOS transistors are connected to each other by at least a plurality of layers.

14. The device according to claim 12, wherein said memory cells each include a stacked type capacitor.

* * * * *